United States Patent [19]

Nakanishi

[11] 4,280,585

[45] Jul. 28, 1981

[54] MULTI-SOUND SPEAKER SYSTEM

[76] Inventor: Motoyoshi Nakanishi, 4-11-13 Honcho, Funabashi-shi 273, Japan

[21] Appl. No.: 125,452

[22] Filed: Feb. 28, 1980

[30] Foreign Application Priority Data

Aug. 27, 1979 [JP] Japan ............................... 54-108118

[51] Int. Cl.[3] ............................................... H05K 5/00
[52] U.S. Cl. ..................................... 181/147; 181/199
[58] Field of Search ................................ 181/144-148, 181/150, 152, 155, 156, 199; 179/1 E

[56] References Cited

U.S. PATENT DOCUMENTS

| | | | |
|---|---|---|---|
| 2,491,982 | 12/1949 | Kincarck | 181/156 |
| 3,142,353 | 7/1964 | Todisco | 181/145 |

FOREIGN PATENT DOCUMENTS

| | | | |
|---|---|---|---|
| 968490 | 2/1958 | Fed. Rep. of Germany | 181/144 |

*Primary Examiner*—L. T. Hix
*Assistant Examiner*—Benjamin R. Fuller
*Attorney, Agent, or Firm*—Montague & Ross

[57] ABSTRACT

A speaker enclosure with a multiplicity of sound-openings in which the back sound pressure from a plurality of front radiating speaker-units mounted in a vertical row on a baffle board, is completely divided at the back of the speaker-units by a centrally located dividing board. Reflecting boards at the corners of the sound paths and left and right sound pressure guide boards fixed to the edges of the baffle board effectively guide the back sound pressure through left and right front openings formed between the guide boards and the sides of the enclosure. The front openings are adjusted by hinged volume and tone control boards to effectively combine the sound pressure radiated from the front-side of the speaker-units with that from the back-side.

2 Claims, 4 Drawing Figures

MULTI-SOUND SPEAKER SYSTEM

BACKGROUND OF THE INVENTION

The purpose of this invention is to provide a speaker system that is compact and light in weight, with excellent frequency response characteristics and low distortion, that is capable of handling comparatively large amounts of audio power, and can be manufactured economically.

Conventional speaker systems are usually high in cost and consist of two-types, the totally enclosed type and the bass-reflex type and usual practice is to employ several types of speaker-units with characteristics designed to handle the low, middle, and high frequencies because of the difficulty in obtaining speaker-units with good response characteristics that can handle the entire audio spectrum. However, when several units are employed to cover the frequency spectrum, interference between the speaker-units at their cross-over frequency bands causes frequency response and other forms of distortion, which tend to affect the overall performance of the speaker system.

Conventional speaker enclosures including the totally enclosed, and the bass-reflex type suffer from the effects of sound pressure released from the openings at the back-side of the speaker-unit, in particular interference between sound pressure from the left and right sides of the unit that develops inside the enclosure and results in a rise in the acoustical impedance causes the phenomenon of 'booming', as well as, a tendancy for the enclosure walls to vibrate, and thereby tends to ruin the system's acoustical characteristics. Consequently, conventional speaker enclosure systems, including high-priced systems have failed to be compact in size and light in weight, and have large power handling capacity with excellent performance characteristics such as good frequency response and low distortion etc.

Recently, the general trend is for speaker-units with smaller size radiators. Consequently, there is a rising demand for compact speaker enclosure systems with excellent acoustical characteristics. However, the conventional design of speaker enclosures does not permit lowering of the low-end frequency response when the enclosure volume is decreased, thus, if the diameter of the speaker-unit is halved, the low-end acoustical output will be reduced by 12 dB and an audio power increase of several fold would be required to obtain the original acoustical output level.

Moreover, with a small size speaker-unit, the low-end cut-off frequency is relatively high, and the effective mass of the unit's vibrating system must be increased in order to lower its cut-off frequency, which in effect lowers the speaker's over-all efficiency.

Furthermore, in conventional speaker enclosure systems in which several different sized speaker-units are employed, elimination of the afore-described interference effect; caused by the acoustical pressure at the back-side of the speaker-units by effectively directing pressure from the left and right sides of the units toward the front has not been successful, even with bass-reflex type enclosures.

SUMMARY OF THE INVENTION

The speaker enclosure system described in this disclosure, is compact and light in weight, yet has excellent acoustical characteristics, not realized in conventional speaker systems. This invention pertains to means whereby, the acoustical back pressure of the speaker-unit radiated from the left and right sides of the unit is divided to prevent interference and guided toward openings at the front of the enclosure system. As a result, relatively high acoustical power output with good efficiency can be obtained together with excellent frequency response and other acoustical characteristics.

Moreover, this speaker enclosure system can be manufactured at a low cost and can be utilized not only for home music systems but also for industrial sound systems and applications. This speaker enclosure system exhibits outstanding performance when used in stereophonic sound systems, as a result of accurate sound source localization through system's correct sound reproduction, and the reproduction of an ambient sound field with excellent quality sound.

DESCRIPTION OF THE PREFERRED EMBODIMENTS

Figure 1:
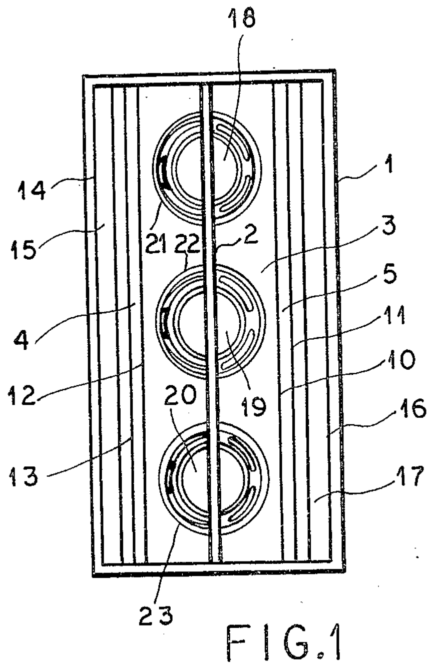
FIG. 1. is a rear-view drawing of the speaker enclosure system seen from the back-side.
Figure 2:
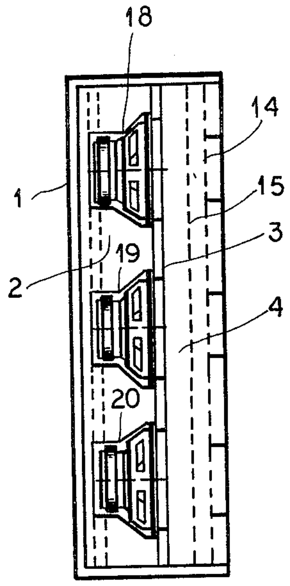
FIG. 2. is a side-view of FIG. 1, seen from the side.
Figure 3:
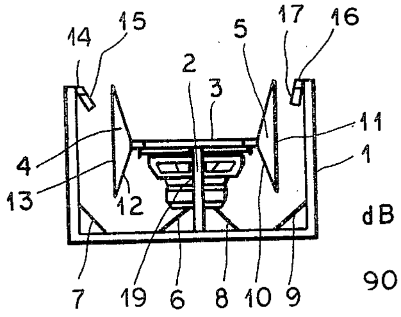
FIG. 3. is a plan-view of FIG. 1, seen from the top.

The following description is an example of an embodiment of this invention and in no ways restricts the claim set forth.

Multiple sound-opening speaker enclosure (1) has left-side primary acoustical pressure guide surface (12) and left-side secondary acoustical pressure guide surface (13), and right-side primary acoustical pressure guide surface (10) and right side secondary acoustical guide surface (11) formed by the respective left-side sound pressure isolating board (4) and right-side sound pressure isolating board (5), which are arranged therein to provide suitable openings at each side of the speaker enclosure's front opening, and also said boards (4) and (5) have installed at a suitable position between them a baffle board on which is mounted a plurality of speaker-units (21), (22), (23) and electrical connections for the input of audio signals are made to these units. Left-right pressure dividing board (2) is mounted centrally on baffle board (3) with suitable packing material (18), (19), (20) inserted to render air-tight the spaces between the back-end of speaker-units (21), (22), (23), and said dividing board (12) is fixed to the inner surface of the back wall of enclosure (1) with left-side primary reflection board (6) and right-side primary reflection board (8) installed at the respective left and right corners formed at the back wall. Left-side secondary reflection board (7) and right-side secondary reflection board (9) are installed at the respective corners of the inner back wall of enclosure (1). Left-side sound quality and sound volume adjustment board (15) and right-side sound quality and sound volume adjustment board (17) are movably mounted by their respective left-side hinge (14) and right-side hinge (16) at the front ends of left and right inner side wall surfaces of enclosure (1). Said left and right side adjustment boards (15) and (17) can be adjusted, as to space between and angle with sound pressure guide board (4) and (5) at their respective side, and thereby enable combining of the sound pressure from the front and back sides of speaker-units (21), (22), (23)

in an effective manner. Thus this multiple sound-opening speaker enclosure system is capable of radiating the combined front and back sound pressure from the front face of the enclosure system, and thereby reproduce an ambient sound field with excellent acoustical characteristics.

A more detailed explanation of how this invention functions follows.

The acoustical sound pressure from the back-side of speaker-units (21), (22), (23) is divided into left and right side sound pressure by left-right sound pressure dividing board (2). Sound pressure on the left-side is guided by primary guide surface (12) of left-side sound pressure guide board (4) to be directed in one direction on the left-side to form the left-side sound pressure output. This sound pressure output is reflected by primary reflecting board (6) and is in turn reflected by secondary reflecting board (7) to be directed toward the front opening of the multiple sound-opening enclosure (1). Secondary guide surface (13) of left-side sound pressure isolating guide board (4), guides the left-side sound pressure toward the front opening by preventing the formation of irregular pressures, sound is emitted effectively through the opening between the above guide surface and the left-side sound quality and volume adjustment board (15), thus, the sound pressure output from the left-side is emitted in the same direction as that from the front side of the speaker-unit to provide sound pressure output from the left front side of the multiple sound-opening speaker enclosure (1).

Sound pressure on the right side of the pressure dividing board (2) is guided by right-side primary guide surface (10) to be directed in one direction on the right-side to form the right-side sound pressure output. This sound pressure output is reflected by primary reflecting board (8) and is in turn reflected by secondary reflecting board (9) to be directed toward the front opening of the multiple sound-opening enclosure (1). Secondary guide surface (11) prevents formation of irregular sound pressure and directs the sound output through the opening between said surface on the right-side and the sound quality and volume adjustment board (17), thus, the sound pressure output from the right-side is emitted in the same direction as that from the front side of the speaker-unit to provide sound pressure output from the right front side of the multiple sound-opening speaker enclosure (1).

Furthermore, by adjusting the left and right openings formed between the respective left-side sound quality and volume adjustment board (15) and right-side sound quality and volume adjustment board (17), the frequency characteristics and volume level of the sound emitted from the respective openings can be effectively and conveniently adjusted thereby enhancing the excellent features of this speaker enclosure system.

To further explain the functional features of this invention.

Heretofore in conventional speaker systems, the back pressure radiated from the left and right sides of the speaker-units collided within the speaker enclosure to cause interference and formation of irregular sound pressures, thereby raising the enclosure's acoustical impedance, resulting in the production of booming sounds or resonances with ill-effects to the speaker-units. Consequently, in the past it was impossible to obtain a compact speaker system with excellent quality sound. Also, it was well neigh impossible to effectively direct the back sound pressure of the speaker-units with good balance between the sound pressure at the front-side of the unit, to produce faithful efficient acoustical output from the front-side.

This invention provides a technical solution to the above described shortcomings. In other words, the sound pressure from the back-side of the speaker-units is divided into left-side and right-side sound pressure by the left-right dividing board (2), with good balance and without irregular sound pressure buildup. Thus, the rise in acoustical impedance of typical speaker enclosures is eliminated, "boominess" in the response is prevented, and vibratory motion of the speaker-cone follows the input signal more faithfully.

Furthermore, the frequency response of small diameter speaker-units generally is excellent at the high-frequencies but starts dropping from the middle to the low frequencies. The frequency characteristics of a commercially available small diameter speaker is illustrated by curve B of FIG. 4. Here a peak in the range from 16 kHz to 8 kHz, and gradual drop in level from 1 kHz to 250 Hz is observed. A rapid drop in level is seen from 125 Hz to 63 Hz.

Figure 4:
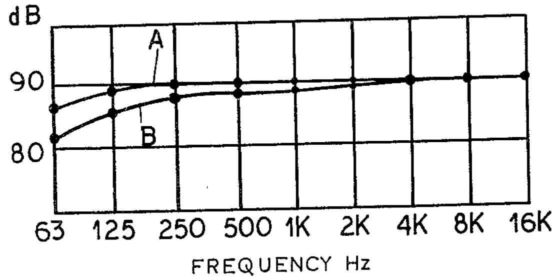
FIG. 4. shows the frequency response characteristics of the speaker enclosure system of this invention, and that of a small-diameter speaker unit.

The frequency characteristics obtained from the speaker enclosure system of this invention using the preceding small speaker-unit is shown as curve A of FIG. 4. Here, the sound pressure from the back of the speaker-unit becomes relatively weakened at the high frequencies compared with the middle and low frequencies. Thus, the sound pressure from the unit's back-side divided by left-right dividing board (2), is emitted from the left and right side openings of the multiple sound-opening enclosure (1) with the middle and low frequencies more strengthened than the high frequencies; by adjusting the angle of the respective left and right sound quality and volume adjusting boards (15) and (17). At the left and right openings, the close to ideal frequency characteristic shown by curve A of FIG. 4. is obtained. In other words, the high frequencies from 16 kHz to 8 kHz are not boosted by the sound pressure from the back-side because these are weakened, whereas the range from 1 kHz to 250 Hz is gradually boosted, while that from 125 Hz to 63 Hz is boosted most strongly, and thereby an ideal frequency characteristic is efficiently obtained, and an effective and faithful reproduction of the ambient sound field results.

To conclude, the following excellent technical features can be obtained.

A reduction in intermodulation distortion over the entire acoustical spectrum, a reduction in interference distortion at all the frequencies, increased clarity of reproduction at the low frequencies, increase in output and easy control at the low frequencies, improved and adjustable balance between the high and low frequencies, and overall improvement in the quality of the reproduced sound.

Other features of this system is the obtaining of an optimum directional sound radiation pattern compatible with various listening enviroments, relatively compact and small sized yet capable of well damped faithful reinforcement of the low frequencies, clear and crisp sound quality with low distortion, and the providing of an excellent speaker enclosure system with high resolving power and dynamic sound characteristics, combined with high efficiency and high acoustical output.

What is claimed is:

1. A multiple sound-opening speaker enclosure (1), consisting of left-side sound pressure guide board (4) with sound pressure guiding surfaces (12) and (13), and right-side sound pressure guide board (5) with sound pressure guiding surfaces (10) and (11), fixed to left and right edges of baffle board (3); with a plurality of speaker-units mounted centrally thereto and electrically connected to receive an input signal, a left-right sound pressure dividing board (2) fixed between baffle board (3) and the interior back surface of the enclosure; with suitable air-tightening material (18), (19), (20) interposed between the dividing board and speaker-units, to completely divide the back sound pressure from the speakers to the left and right sides of the enclosure, the left and right side sound pressure guide boards (4) and (5) being appropriately spaced from the respective interior of the enclosure (1) so that, in conjunction with reflecting corner pieces (6), (7), (8), (9), the emitted back pressure from each side of the speaker-units is directed toward the left and right front sound openings, sound volume and tone adjusting boards (15) and (17) are adjustably mounted on the left and right sides of the enclosure by hinges (14) and (16) to enable adjusting of the front directed back sound pressure to effectively combine with the sound radiated from the front side of the speaker-units to provide excellent sound reproduction in an efficient manner.

2. A multiple sound-opening enclosure consisting of a left-side sound-pressure guide board (4) with sound-pressure guiding surfaces (12) and (13), and right-side sound-pressure guide board (5) with sound-pressure guiding surfaces (10) and (11); appropriately spaced from the interior sides of the enclosure and suitably fixed to the left and right edges of a baffle board, a left-right sound-pressure dividing board (2) with pressure leakage prevention packing pieces (18), (19), (20) centrally fixed between the baffle board and back interior surface of the enclosure, sound pressure reflecting boards (6), (7), (8), (9) fixed to the inner corners of the enclosure and left-side sound volume and tone adjusting board (15) and right-side sound volume and tone adjusting board (17); adjustably mounted to the front inner sides of the enclosure by hinges (14) and (16) to permit adjustment of the angle of each board to provide excellent quality sound reproduction in an effective manner.

* * * * *